United States Patent
Kusuda

(10) Patent No.: US 7,531,771 B2
(45) Date of Patent: May 12, 2009

(54) HEAT TREATMENT APPARATUS OF LIGHT EMISSION TYPE

(75) Inventor: Tatsufumi Kusuda, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 110 days.

(21) Appl. No.: 11/692,378

(22) Filed: Mar. 28, 2007

(65) Prior Publication Data

US 2007/0229657 A1 Oct. 4, 2007

(30) Foreign Application Priority Data

Mar. 29, 2006 (JP) .............................. 2006-090074

(51) Int. Cl.
*H05B 6/54* (2006.01)

(52) U.S. Cl. ...................... 219/780; 219/61.6; 219/119; 219/770

(58) Field of Classification Search .................. 315/46, 315/115, 152, 156, 158; 392/411, 416, 418, 392/422; 219/395, 402, 405, 411–412, 61.6, 219/119, 770, 780

See application file for complete search history.

(56) References Cited

U.S. PATENT DOCUMENTS

| 7,068,926 B2 * | 6/2006 | Nozaki ........................ 392/416 |
| 2003/0114019 A1 * | 6/2003 | Miyauchi et al. ............ 438/795 |
| 2003/0132692 A1 * | 7/2003 | Eguchi ......................... 313/10 |
| 2004/0008980 A1 * | 1/2004 | Morimoto et al. ............ 392/418 |
| 2004/0206743 A1 * | 10/2004 | Murayama ................... 219/390 |

FOREIGN PATENT DOCUMENTS

| JP | 2004-55821 | 2/2004 |
| JP | 2004-88052 | 3/2004 |
| JP | 2004273943 A * | 9/2004 |

* cited by examiner

*Primary Examiner*—David Hung Vu
*Assistant Examiner*—Tung X Le
(74) *Attorney, Agent, or Firm*—Ostrolenk, Faber, Gerb & Soffen, LLP

(57) ABSTRACT

A reflector is so provided as to entirely cover a plurality of flash lamps arranged in parallel with one another. The reflector reflects flash light emitted from the flash lamps. A plurality of trigger electrodes needed to allow the flash lamps to discharge are so fixed to the reflector with insulating members interposed therebetween, respectively, as to be proximately opposed to the plurality of flash lamps in a one-to-one correspondence with each other. This eliminates the necessity to provide trigger wires one by one near the flash lamps during the maintenance of the apparatus, the change of lamps or the like, and it is possible to easily provide the trigger electrodes near the flash lamps only by fixing the reflector at a predetermined set position.

5 Claims, 6 Drawing Sheets

F I G. 2
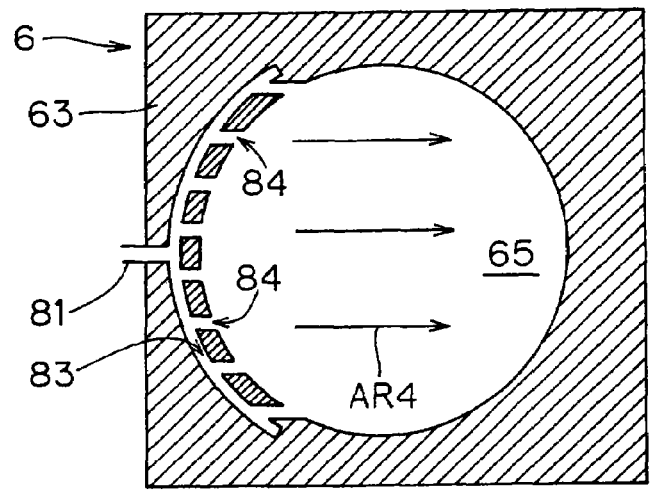
F I G. 3
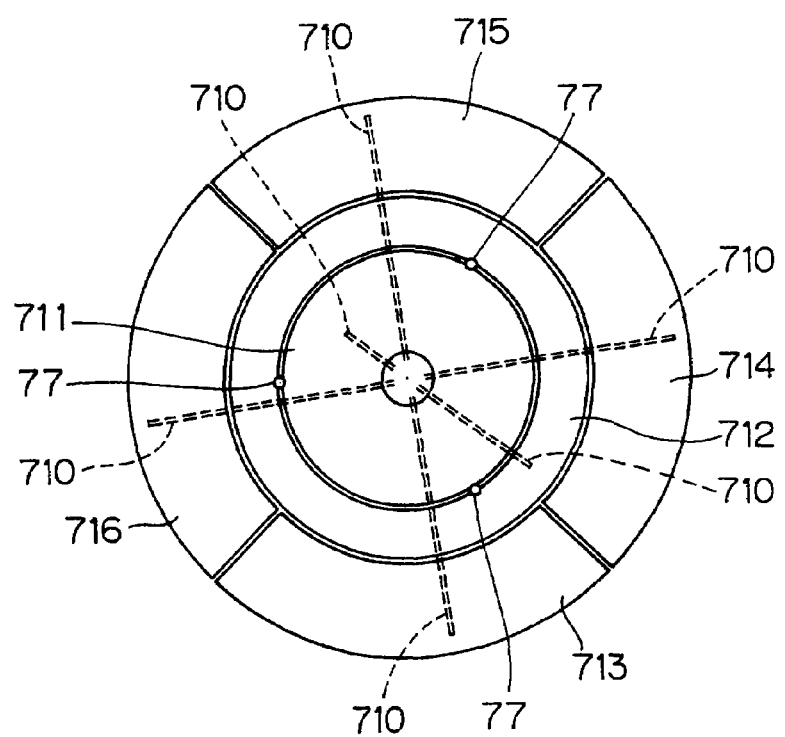

CONTROLLER
3

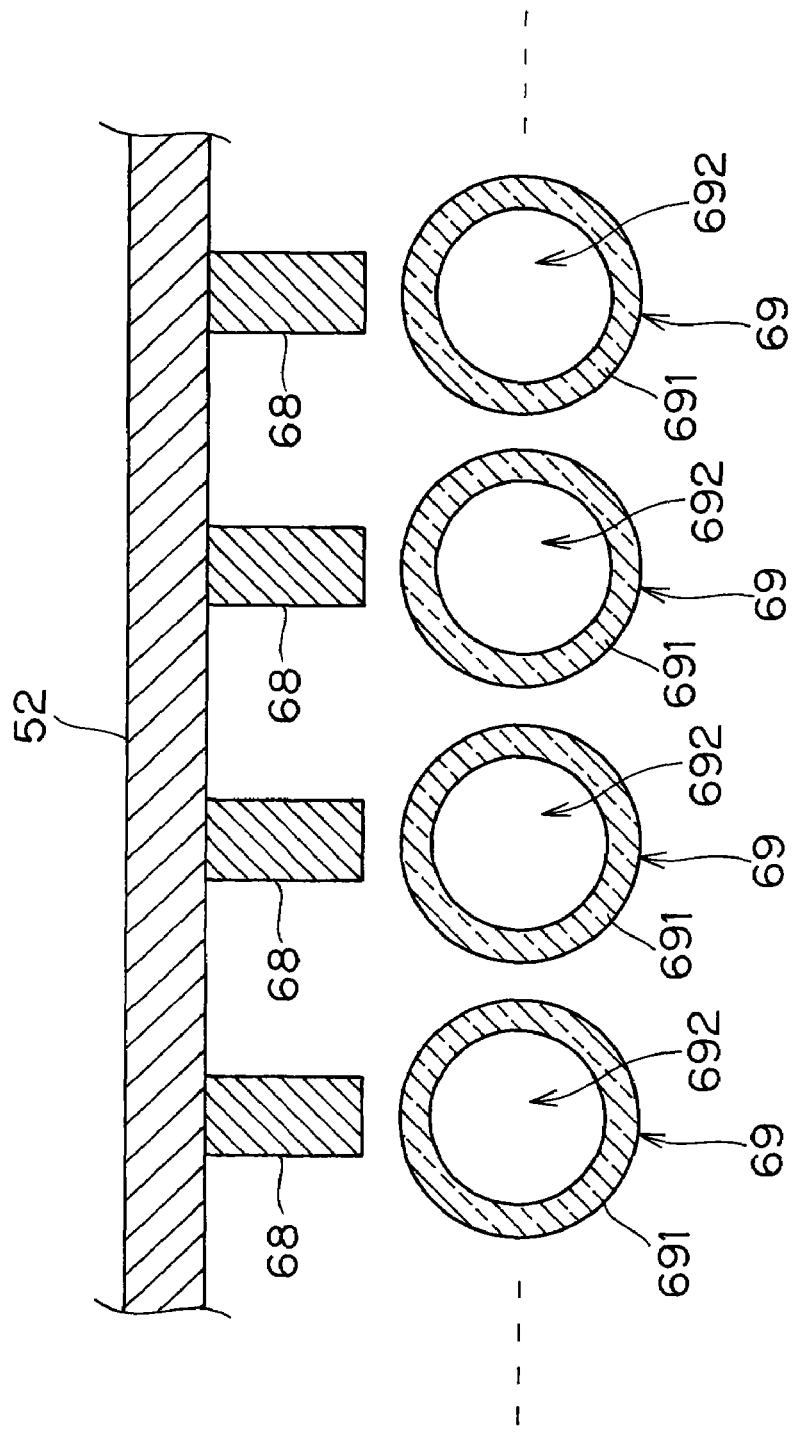

HEAT TREATMENT APPARATUS OF LIGHT EMISSION TYPE

BACKGROUND OF THE INVENTION

1. Field of the Invention

The present invention relates to a heat treatment apparatus for exposing a substrate including a semiconductor wafer, a glass substrate for a liquid crystal display device and the like to a flash of light to heat the substrate.

2. Description of the Background Art

Conventionally, a lamp annealer employing a halogen lamp has been typically used in the step of activating ions in a semiconductor wafer after ion implantation. Such a lamp annealer carries out the activation of ions in the semiconductor wafer by heating (or annealing) the semiconductor wafer to a temperature of, e.g., about 1000° C. to 1100° C. Such a heat treatment apparatus utilizes the energy of light emitted from the halogen lamp to raise the temperature of a substrate at a rate of about hundreds of degrees per second.

In recent years, with the increasing degree of integration of semiconductor devices, it has been desired to provide a shallower junction as the gate length decreases. It has turned out, however, that even the execution of the process of activating ions in a semiconductor wafer by the use of the above-mentioned lamp annealer which raises the temperature of the semiconductor wafer at a rate of about hundreds of degrees per second produces a phenomenon in which the ions of boron, phosphorus and the like implanted in the semiconductor wafer are diffused deeply by heat. The occurrence of such a phenomenon causes the depth of the junction to exceed a required level, giving rise to apprehension about a hindrance to good device formation.

To solve the problem, in Japanese Patent Application Laid Open Gazette Nos. 2004-55821 and 2004-88052, there has been proposed a technique for exposing a surface of a semiconductor wafer to a flash of light by using a plurality of xenon flash lamps to raise the temperature of only the surface of the semiconductor wafer, which is implanted with ions, in an extremely short time (several milliseconds or less). The xenon flash lamp has a spectral distribution of radiation ranging from ultraviolet to near-infrared regions. The wavelength of light emitted from the xenon flash lamp is shorter than that of light emitted from the conventional halogen lamp, and almost coincides with a fundamental absorption band of a silicon semiconductor wafer. It is therefore possible to quickly raise the temperature of the semiconductor wafer, with a small amount of light transmitted through the semiconductor wafer, when the semiconductor wafer is exposed to a flash of light emitted from the xenon flash lamp. Also, it has turned out that a flash of light emitted in an extremely short time of several milliseconds or less can selectively raise the temperature of only near the surface of the semiconductor wafer. Therefore, the temperature rise in an extremely short time by using the xenon flash lamp allows the execution of only the ion activation without deep diffusion of the ions.

The xenon flash lamp has a construction in which an anode and a cathode are provided at both ends of a glass tube filled with xenon gas. Since the xenon gas is an insulator, no discharge is caused in the glass tube by simply applying a voltage between the electrodes at its both ends. Therefore, in order to cause a discharge, a trigger wire is provided near the outside of the glass tube and a high voltage is applied to the trigger wire, with a predetermined voltage applied between the electrodes at both the ends of the glass tube, to break the insulation of the xenon gas. Since such a trigger wire has to be provided near the glass tube, in the apparatuses having a plurality of xenon flash lamps, which are disclosed in Japanese Patent Application Laid Open Gazette Nos. 2004-55821 and 2004-88052, a trigger wire is provided near each of the xenon flash lamps.

A complicated operation, however, is needed to provide a trigger wire immediately near the glass tube. Especially, in an apparatus having a lot of xenon flash lamps, it is necessary to provide trigger wires for all the lamps during the maintenance, change of lamps or the like, and this raises a problem of imposing an enormous operation load.

Further, if trigger wires must be provided for a plurality of xenon flash lamps, respectively, trigger circuits in accordance with the number of trigger wires to be provided are needed. As the number of trigger circuits increases, the frequency of occurrence of circuit failures increases in proportion. Furthermore, if the timings of applying a voltage to a lot of trigger circuits get out of sync even slightly, the timings of illumination of a plurality of xenon flash lamps also get out of sync, and there is apprehension that this might cause a hindrance to the heat treatment of the semiconductor wafer.

Moreover, since the trigger wire is provided immediately near the glass tube, it receives a great thermal influence on exposure to a flash of light. For this reason, though a refractory metal such as tungsten (W) is used as a material of the trigger wire, there is apprehension that the trigger wire might be broken by oxidation on exposure to a flash of light. Though it is possible to prevent high temperature oxidation if the trigger wire is made of a precious metal, this raises a problem of remarkably increased cost.

SUMMARY OF THE INVENTION

The present invention is intended for a heat treatment apparatus for exposing a substrate to a flash of light to heat the substrate.

According to the present invention, the heat treatment apparatus comprises a plurality of flash lamps for emitting flash light by discharge caused between electrodes provided at both ends in the interior of a discharge tube, a holding element for holding a substrate, a reflecting plate for reflecting flash light emitted from the plurality of flash lamps towards the holding element, the reflecting plate being so disposed as to be opposed to the holding element with the plurality of flash lamps interposed therebetween and to cover the plurality of flash lamps, and a plurality of trigger electrodes for allowing the plurality of flash lamps to start discharging, the plurality of trigger electrodes being so fixed to the reflecting plate as to be proximately opposed to the plurality of flash lamps in a one-to-one correspondence with each other.

Since the plurality of trigger electrodes are fixed to the reflecting plate covering the plurality of flash lamps, it is possible to easily provide the trigger electrodes only by fixing the reflecting plate at a predetermined position in the apparatus. Further, since it is possible to increase the capacity of the trigger electrode if the trigger electrodes are fixed to the reflecting plate, the heat that the trigger electrodes receive on exposure to a flash of light is quickly conducted, to be diffused, and it is possible to increase the durability of the trigger electrodes against exposure to a flash of light.

Preferably, the reflecting plate is made of a conductive material, and the plurality of trigger electrodes are so fixed to the reflecting plate as to establish electrical conduction, and the heat treatment apparatus further comprises a single trigger circuit for applying a voltage which allows the plurality of flash lamps to start discharging to the plurality of trigger electrodes through the reflecting plate, the trigger circuit establishing electrical conduction with the reflecting plate.

Since the single trigger circuit applies a voltage which serves to start discharging to the plurality of trigger electrodes through the reflecting plate, it is possible to apply a voltage to the plurality of trigger electrodes at the completely same timing.

Therefore, it is a first object of the present invention to provide a heat treatment apparatus having high durability against exposure to a flash of light.

It is a second object of the present invention to provide a heat treatment apparatus capable of applying a voltage to a plurality of trigger electrodes at the completely same timing.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a sectional view showing a gas passage in the heat treatment apparatus of FIG. 1;

FIG. 3 is a plan view showing a hot plate in the heat treatment apparatus of FIG. 1;

FIG. 7 is a partially sectional view showing a reflector and flash lamps in accordance with the second preferred embodiment.

DESCRIPTION OF THE PREFERRED EMBODIMENTS

The preferred embodiments of the present invention will now be discussed in detail with reference to the drawings.

1. The First Preferred Embodiment

Figure 1:
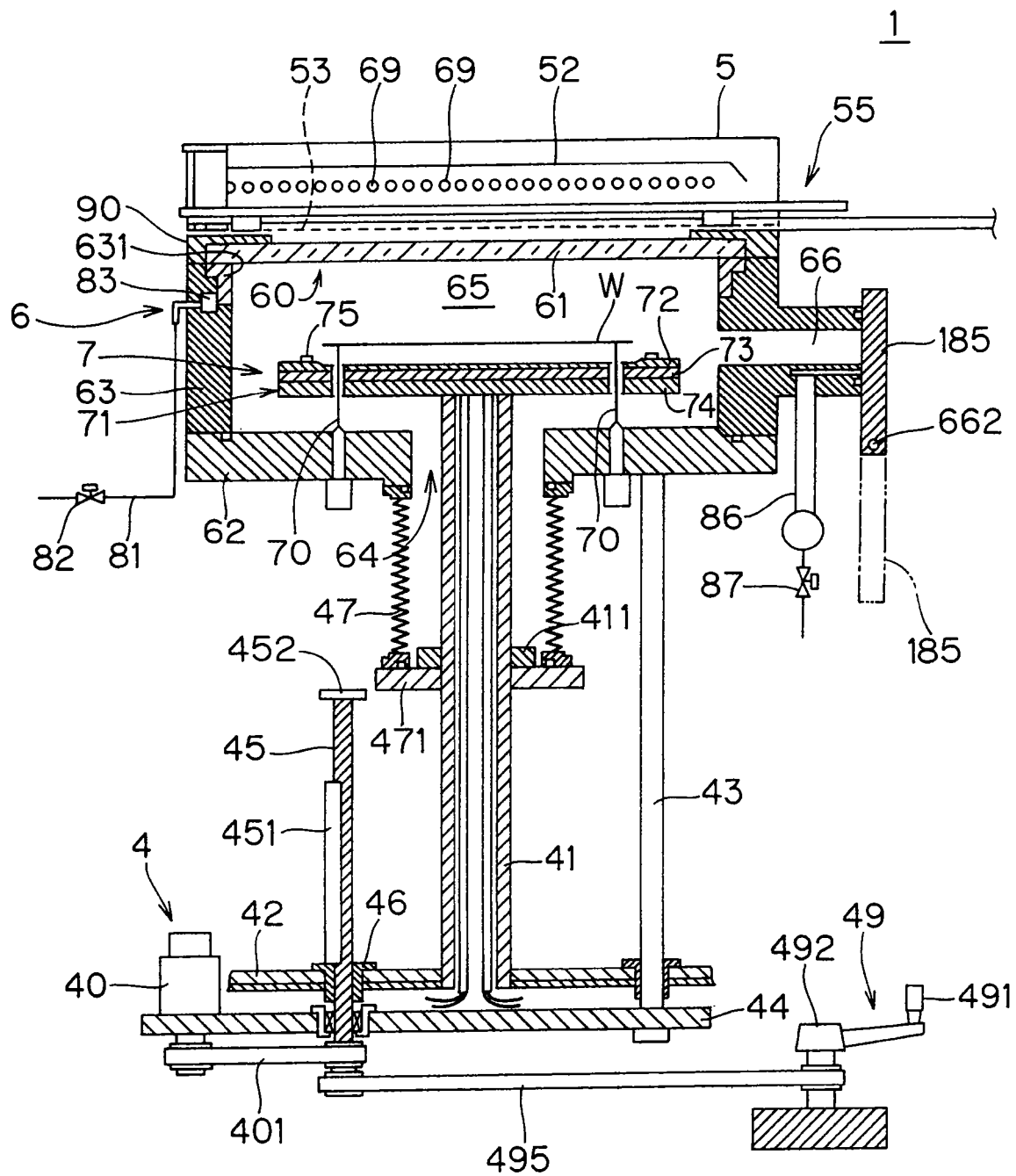
FIG. 1 is a sectional side view showing a construction of a heat treatment apparatus in accordance with the present invention.

First, the overall construction of a heat treatment apparatus in accordance with the present invention will be outlined. FIG. 1 is a sectional side view showing the construction of a heat treatment apparatus 1 in accordance with the present invention. The heat treatment apparatus 1 is a flash lamp annealer for exposing a semiconductor wafer W of generally circular shape, serving as a substrate, to a flash of light to heat the semiconductor wafer W.

The heat treatment apparatus 1 comprises a chamber 6 of generally cylindrical configuration for accommodating a semiconductor wafer W therein. The chamber 6 includes a chamber side portion 63 having an inner wall of generally cylindrical configuration, and a chamber bottom portion 62 for covering a bottom portion of the chamber side portion 63. A space surrounded by the chamber side portion 63 and the chamber bottom portion 62 is defined as a heat treatment space 65. A top opening 60 is formed over the heat treatment space 65.

The heat treatment apparatus 1 further comprises a light-transmittable plate 61 serving as a closure member mounted in the top opening 60 for closing the top opening 60, a holding part 7 of generally disk-shaped configuration for preheating a semiconductor wafer W while holding the semiconductor wafer W within the chamber 6, a holding part elevating mechanism 4 for moving the holding part 7 upwardly and downwardly relative to the chamber bottom portion 62 serving as the bottom surface of the chamber 6, a light emitting part 5 for emitting light through the light-transmittable plate 61 onto the semiconductor wafer W held by the holding part 7 to heat the semiconductor wafer W, and a controller 3 for controlling the above-mentioned components to perform heat treatment.

The chamber 6 is provided under the light emitting part 5. The light-transmittable plate 61 provided in an upper portion of the chamber 6 is a disk-shaped member made of, e.g., quartz, and serves as a chamber window which allows light emitted from the light emitting part 5 to travel therethrough into the heat treatment space 65. The chamber bottom portion 62 and the chamber side portion 63 which constitute the main body of the chamber 6 are made of a metal material having high strength and high heat resistance such as stainless steel and the like. A ring 631 provided in an upper portion of the inner side surface of the chamber side portion 63 is made of an aluminum (Al) alloy and the like having greater durability against degradation resulting from exposure to light than stainless steel.

An O-ring provides a seal between the light-transmittable plate 61 and the chamber side portion 63 so as to maintain the hermeticity of the heat treatment space 65. Specifically, the O-ring is inserted between a lower peripheral portion of the light-transmittable plate 61 and the chamber side portion 63 and a clamp ring 90 abuts against an upper peripheral portion of the light-transmittable plate 61 to be secured to the chamber side portion 63 by screws, thereby forcing the light-transmittable plate 61 onto the O-ring.

The chamber bottom portion 62 is provided with a plurality of (in this preferred embodiment, three) upright support pins 70 extending through the holding part 7 for supporting the lower surface (a surface opposite to a surface onto which light is emitted from the light emitting part 5) of the semiconductor wafer W. The support pins 70 are made of, e.g., quartz, and are easy to replace because the support pins 70 are fixed externally of the chamber 6.

The chamber side portion 63 includes a transport opening 66 for the transport of the semiconductor wafer W therethrough into and out of the chamber 6. The transport opening 66 is openable and closable by a gate valve 185 pivoting about an axis 662. An inlet passage 81 for introducing a process gas (for example, an inert gas including nitrogen (N2) gas, helium (He) gas, argon (Ar) gas and the like, or oxygen (O2) gas and the like) into the heat treatment space 65 is formed on the side of the chamber side portion 63 opposite to the transport opening 66. The inlet passage 81 has a first end connected through a valve 82 to a not-shown gas supply mechanism and a second end connected to a gas inlet buffer 83 formed inside the chamber side portion 63. The transport opening 66 is provided with an outlet passage 86 for exhausting the gas from the interior of the heat treatment space 65. The outlet passage 86 is connected through a valve 87 to a not-shown exhaust mechanism.

FIG. 2 is a sectional view of the chamber 6 taken along a horizontal plane at the level of the gas inlet buffer 83. As shown in FIG. 2, the gas inlet buffer 83 extends over approximately one-third of the inner periphery of the chamber side portion 63 on the opposite side to the transport opening 66 shown in FIG. 1. The process gas introduced through the inlet passage 81 to the gas inlet buffer 83 is fed through a plurality of gas feed holes 84 into the heat treatment space 65.

The holding part elevating mechanism 4 shown in FIG. 1 includes a shaft 41 of generally cylindrical configuration, a movable plate 42, guide members 43 (three guide members 43 are actually provided around the shaft 41 in this preferred embodiment), a fixed plate 44, a ball screw 45, a nut 46, and a motor 40. The chamber bottom portion 62 serving as the bottom portion of the chamber 6 is formed with a bottom opening 64 of generally circular configuration having a diameter smaller than that of the holding part 7. The shaft 41 made of stainless steel is inserted through the bottom opening 64 and connected to the lower surface of the holding part 7 (a hot plate 71 of the holding part 7 in a strict sense) to support the holding part 7.

The nut 46 for threaded engagement with the ball screw 45 is fixed to the movable plate 42. The movable plate 42 is slidably guided by the guide member 43 fixed to the chamber bottom portion 62 and extending downwardly therefrom, and is vertically movable. The movable plate 42 is coupled through the shaft 41 to the holding part 7.

The motor 40 is provided on the fixed plate 44 mounted to the lower end portion of the guide member 43, and is connected to the ball screw 45 through a timing belt 401. When the holding part elevating mechanism 4 moves the holding part 7 upwardly and downwardly, the motor 40 serving as a driver rotates the ball screw 45 under the control of the controller 3 to move the movable plate 42 fixed to the nut 46 vertically along the guide member 43. As a result, the shaft 41 fixed to the movable plate 42 moves vertically, whereby the holding part 7 connected to the shaft 41 smoothly moves upwardly and downwardly between a transfer position shown in FIG. 1 in which the semiconductor wafer W is transferred and a heat treatment position shown in FIG. 4 in which the semiconductor wafer W is heat-treated.

An upright mechanical stopper 451 of generally semi-cylindrical configuration (obtained by cutting a cylinder in half in a longitudinal direction) is provided on the upper surface of the movable plate 42 so as to extend along the ball screw 45. If the movable plate 42 is to move upwardly beyond a predetermined upper limit because of any anomaly, the upper end of the mechanical stopper 451 strikes an end plate 452 provided at an end portion of the ball screw 45, whereby the abnormal upward movement of the movable plate 42 is prevented. This avoids the upward movement of the holding part 7 above a predetermined position lying under the light-transmittable plate 61, to thereby prevent a collision between the holding part 7 and the light-transmittable plate 61.

The holding part elevating mechanism 4 further includes a manual elevating part 49 for manually moving the holding part 7 upwardly and downwardly during the maintenance of the interior of the chamber 6. The manual elevating part 49 has a handle 491 and a rotary shaft 492. Rotating the rotary shaft 492 by means of the handle 491 causes the rotation of the ball screw 45 connected through a timing belt 495 to the rotary shaft 492, to thereby move the holding part 7 upwardly and downwardly.

An expandable/contractible bellows 47 surrounding the shaft 41 and extending downwardly from the chamber bottom portion 62 is provided under the chamber bottom portion 62, and has an upper end connected to the lower surface of the chamber bottom portion 62. The bellows 47 has a lower end mounted to a bellows lower end plate 471. The bellows lower end plate 471 is screw-held and mounted to the shaft 41 by a collar member 411. The bellows 47 contracts when the holding part elevating mechanism 4 moves the holding part 7 upwardly relative to the chamber bottom portion 62, and expands when the holding part elevating mechanism 4 moves the holding part 7 downwardly. When the holding part 7 moves upwardly and downwardly, the bellows 47 contracts and expands to maintain the heat treatment space 65 hermetically sealed.

The holding part 7 includes the hot plate 71 for preheating (or assist-heating) the semiconductor wafer W, and a susceptor 72 provided on the upper surface (a surface on which the holding part 7 holds the semiconductor wafer W) of the hot plate 71. The shaft 41 for moving the holding part 7 upwardly and downwardly as mentioned above is connected to the lower surface of the holding part 7. The susceptor 72 is made of quartz (or may be made of aluminum nitride (AlN) or the like). Pins 75 for preventing the semiconductor wafer W from shifting out of place are mounted on the upper surface of the susceptor 72. The susceptor 72 is provided on the hot plate 71, with the lower surface of the susceptor 72 in face-to-face contact with the upper surface of the hot plate 71. Thus, the susceptor 72 diffuses heat energy from the hot plate 71 to transfer the heat energy to the semiconductor wafer W placed on the upper surface of the susceptor 72, and is removable from the hot plate 71 for cleaning during the maintenance.

The hot plate 71 includes an upper plate 73 and a lower plate 74 both made of stainless steel. Resistance heating wires such as nichrome wires for heating the hot plate 71 are provided between the upper plate 73 and the lower plate 74, and an electrically conductive brazing metal containing nickel (Ni) fills the space between the upper plate 73 and the lower plate 74 to seal the resistance heating wires therewith. The upper plate 73 and the lower plate 74 have brazed or soldered ends.

FIG. 3 is a plan view of the hot plate 71. As shown in FIG. 3, the hot plate 71 has a circular zone 711 and an annular zone 712 arranged in concentric relation with each other and positioned in a central portion of a region opposed to the semiconductor wafer W held by the holding part 7, and four zones 713 to 716 into which a substantially annular region surrounding the zone 712 is circumferentially equally divided. Slight gaps are formed between these zones 711 to 716. The hot plate 71 is provided with three through holes 77 receiving the support pins 70 therethrough, respectively, and circumferentially spaced apart from one another every 120 degrees in a gap between the zones 711 and 712.

In the six zones 711 to 716, the resistance heating wires independent of one another are disposed so as to make a circuit to form heaters, respectively. The heaters incorporated in the zones 711 to 716 individually heat the zones, respectively. The semiconductor wafer W held by the holding part 7 is heated by the heaters incorporated in the six zones 711 to 716. A sensor 710 for measuring the temperature of each zone by using a thermocouple is provided in each of the zones 711 to 716. The sensors 710 pass through the interior of the shaft 41 of generally cylindrical configuration and are connected to the controller 3.

For heating the hot plate 71, the controller 3 controls the amount of power supply to the respective resistance heating wires provided in the zones 711 to 716 so that the respective temperatures of the six zones 711 to 716 measured by the sensors 710 should reach a predetermined temperature which is previously set. The temperature control in each zone by the controller 3 is PID (Proportional, Integral, Derivative) control. In the hot plate 71, the respective temperatures of the zones 711 to 716 are continually measured until the heat treatment of the semiconductor wafer W (if a plurality of semiconductor wafers W are successively heat-treated, the heat treatment of all the semiconductor wafers W) is completed, and the amounts of power supply to the respective resistance heating wires provided in the zones 711 to 716 are individually controlled, that is, the temperatures of the respective heaters incorporated in the zones 711 to 716 are individually controlled, whereby the respective temperatures of the zones 711 to 716 are maintained at set temperatures. The respective set temperatures for the zones 711 to 716 may be changed from a reference temperature by individually-set offset values.

The respective resistance heating wires provided in the six zones 711 to 716 are connected through power lines passing through the interior of the shaft 41 to a power source (not shown). The power lines extending from the power source to the zones 711 to 716 are disposed inside a stainless tube filled with an insulator of magnesia (magnesium oxide) or the like so as to be electrically insulated from each other. The interior of the shaft 41 is open to the atmosphere.

The light emitting part 5 shown in FIG. 1 is a light source including a plurality of (in this preferred embodiment, 30) xenon flash lamps (referred to simply as "flash lamps" hereinafter) 69, and a reflector 52. The plurality of flash lamps 69 each of which is a rodlike lamp having an elongated cylindrical configuration are arranged in a plane so that the respective longitudinal directions of the flash lamps 69 are in parallel with one another along a major surface of the semiconductor wafer W held by the holding part 7. Each of the xenon flash lamps 69 has a construction in which an anode and a cathode which are connected to a capacitor are provided at both ends in the interior of a transparent glass tube (discharge tube) filled with a small amount of xenon gas.

The reflector 52 is a reflecting plate provided over the plurality of flash lamps 69 to entirely cover the flash lamps 69, to be opposed to the holding part 7 with the flash lamps 69 interposed therebetween. The basic function of the reflector 52 is to reflect the flash light emitted from the plurality of flash lamps 69 towards the holding part 7. The reflector 52 is made of an aluminum alloy plate and its surface (on the side facing the flash lamps 69) is roughened by abrasive blasting to have a satin finish thereon. The reason why the surface is roughened in such a manner is that if the surface of the reflector 52 has a complete mirror finish, there arises a regular pattern in intensity of the reflected light from the flash lamps 69 to degrade the uniformity of surface temperature distribution of the semiconductor wafer W. A light diffusion plate 53 (or a diffuser) is made of quartz glass having a surface subjected to a light diffusion process, and is provided on the lower surface side of the light emitting part 5, with a predetermined spacing held between the light diffusion plate 53 and the light-transmittable plate 61. The heat treatment apparatus 1 further comprises an emitting part movement mechanism 55 for moving the light emitting part 5 upwardly relative to the chamber 6 and then for sliding the light emitting part 5 in a horizontal direction during the maintenance.

Since the xenon gas with which the interior of the discharge tube of the xenon flash lamp 69 is filled is electrically insulative, no current flows in the discharge tube in a normal state even when a voltage is applied between the electrodes at both the ends of the tube. Therefore, in the state where a voltage is applied between the electrodes at both the ends of the tube, a trigger to start discharging has to be externally given and it is a trigger electrode to provide this trigger.

Figure 5:
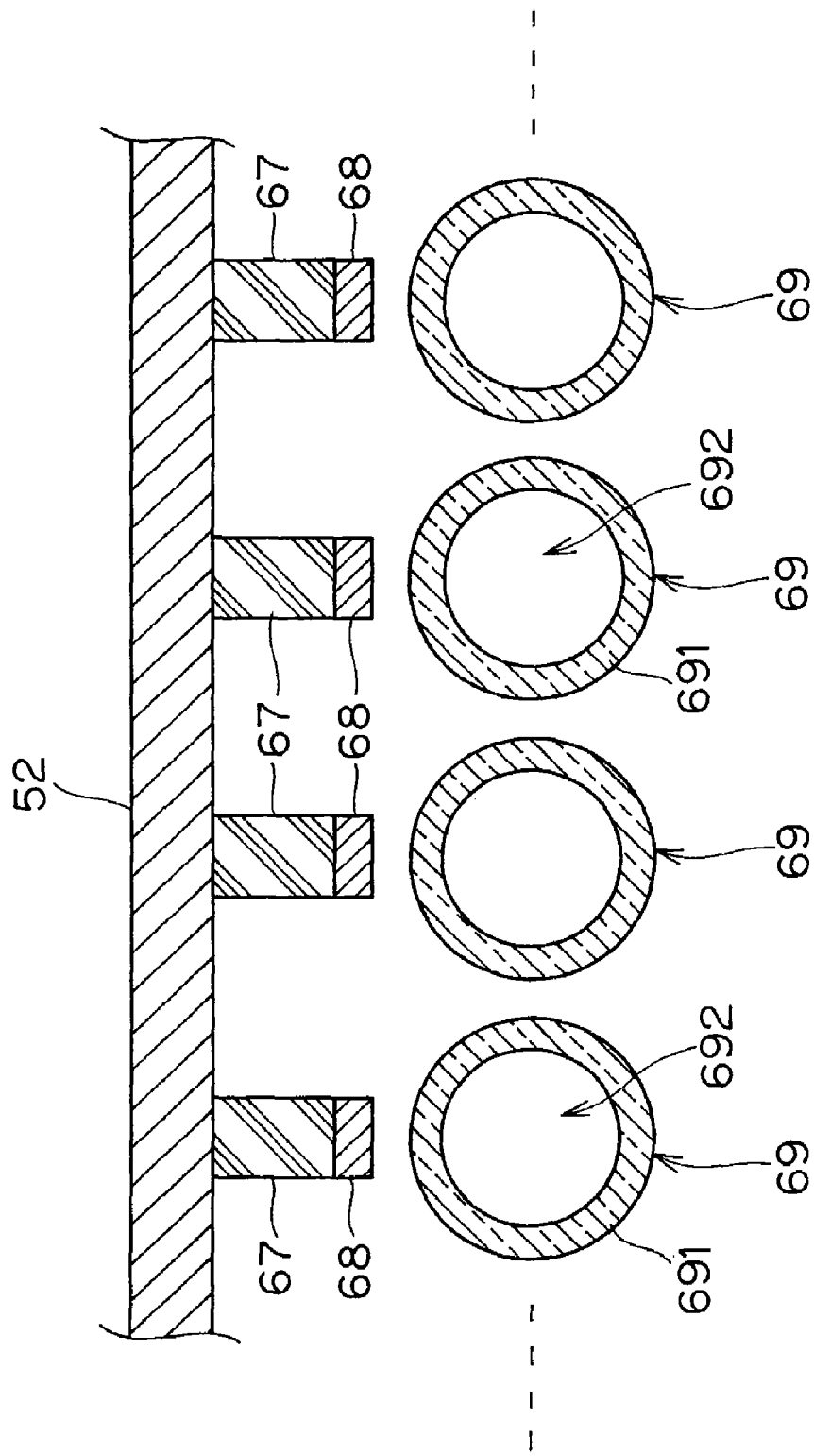
FIG. 5 is a partially sectional view showing a reflector and flash lamps in accordance with the first preferred embodiment.

FIG. 5 is a partially sectional view showing the reflector 52 and flash lamps 69 in accordance with the first preferred embodiment. A discharge tube 691 of the flash lamp 69 is a transparent glass tube of cylindrical configuration, and a hollow space 692 in the interior thereof is filled with xenon gas. The diameter of the flash lamp 69, i.e., the outer diameter of the discharge tube 691 is about 15 mm. The distance from the upper end of the flash lamp 69 to the reflector 52 is set to be about 3 mm.

The trigger electrodes 68 are so fixed to the reflector 52 as to be proximately opposed to the plurality of flash lamps 69 in a one-to-one correspondence with each other. In the first preferred embodiment, since 30 flash lamps 69 are provided in the light emitting part 5, 30 trigger electrodes 68 are also provided. The trigger electrodes 68, each of which has a long-length square pole configuration and is made of aluminum (or nickel) having high durability against a flash, are provided immediately above the flash lamps 69 and proximately thereto along the longitudinal direction of the lamps. Each of the trigger electrodes 68 has a sectional shape of rectangle with about 1 mm in length and about 2 mm in width.

In the first preferred embodiment, insulating members 67 are fixed to the reflector 52 and the trigger electrodes 68 are provided on the insulating members 67, respectively. Specifically, the trigger electrodes 68 are fixed to the reflector 52 with the insulating members 67 interposed therebetween, respectively. Naturally, the insulating members 67 as many as the trigger electrodes 68 (in this preferred embodiment, 30 members) are provided. Each of the insulating members 67 is made of ceramic (e.g., silica ($SiO_2$)) or Teflon (a registered trademark of DuPont), which has the insulation property, and has a long-length square pole configuration. Since the trigger electrodes 68 are fixed to the reflector 52 with the insulating members 67 interposed therebetween, respectively, the trigger electrodes 68 and the reflector 52 are electrically insulated from each other.

Figure 6:
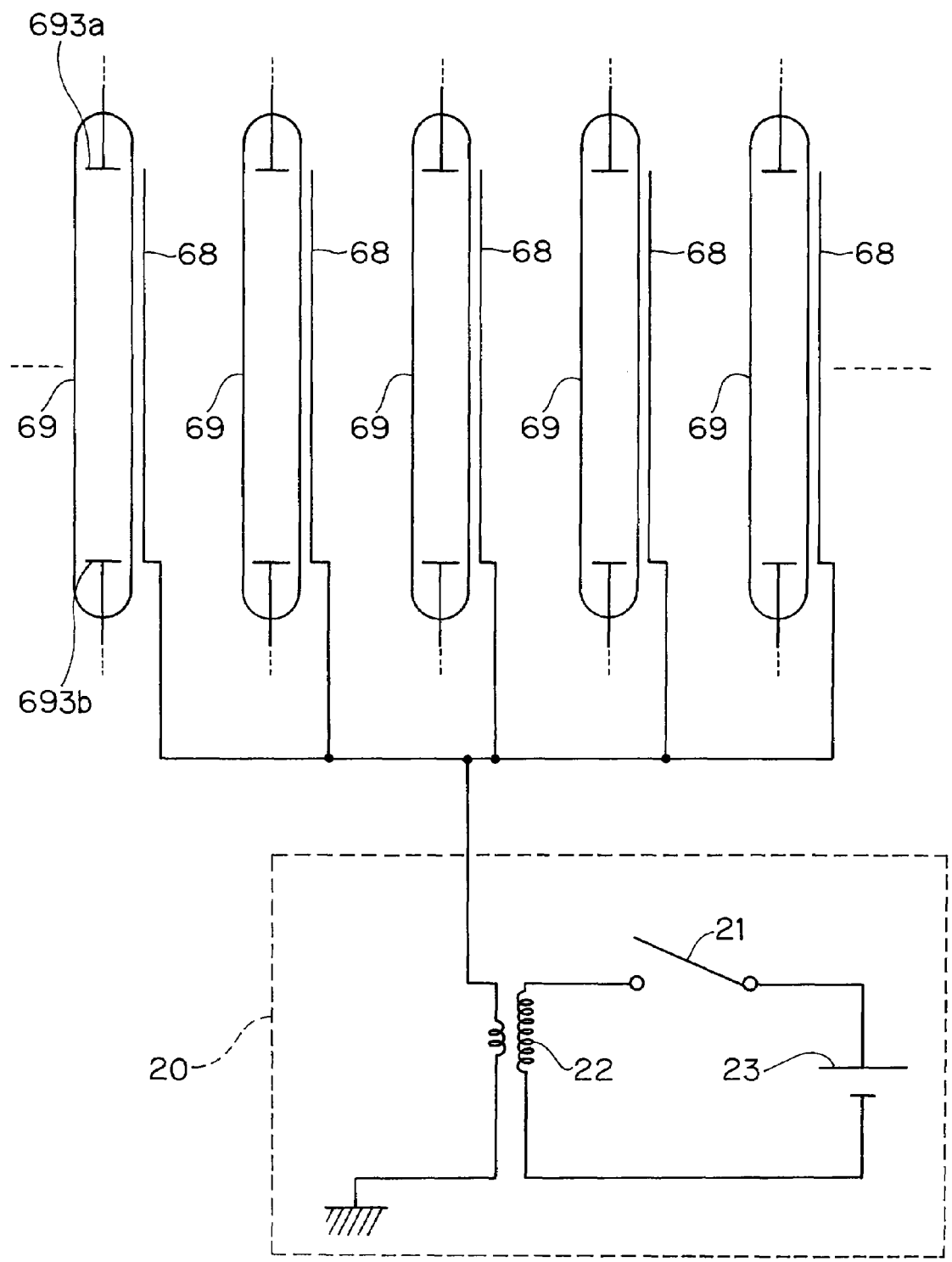
FIG. 6 is a view showing a trigger circuit for applying a voltage to trigger electrodes.

FIG. 6 is a view showing a trigger circuit for applying a voltage to the trigger electrodes 68. In each of the plurality of flash lamps 69, electrodes 693a and 693b at its both ends are connected to a capacitor (not shown). Further, the trigger electrodes 68 fixed to the reflector 52 are provided immediately above the flash lamps 69, respectively. In the first preferred embodiment, 30 trigger electrodes 68 are provided correspondingly to the 30 flash lamps 69, and these 30 trigger electrodes 68 are connected in parallel to a single trigger circuit 20. The trigger circuit 20 comprises a trigger power supply 23, a trigger switch 21 and a step-up coil 22. When the trigger switch 21 is turned on, a high voltage is applied to all the 30 trigger electrodes 68 through the step-up coil 22 at the same timing. In the first preferred embodiment, the voltage applied to the trigger electrodes 68 when the trigger switch 21 is turned on is about 20000 V.

When electric charges are accumulated in the capacitor connected to the electrodes 693a and 693b at both the ends of each flash lamp 69, a voltage in accordance with the amount of accumulated electric charges is applied between the electrodes 693a and 693b at both the ends. In the first preferred embodiment, the voltage applied between the electrodes 693a and 693b is about 4000 V. As discussed above, since the xenon gas with which the discharge tube 691 of each flash lamp 69 is filled is an insulator, no discharge is caused in the discharge tube by simply applying a voltage between the electrodes 693a and 693b at its both ends.

If the trigger switch 21 is turned on and a high voltage of about 20000 V is applied to the trigger electrodes 68 to break the insulation inside the discharge tube 691 in the state where a high voltage is applied between the electrodes 693a and 693b at both the ends of the flash lamp 69, however, the electric charges accumulated in the capacitor momentarily flow (are discharged), and the xenon gas is heated by the Joule heat to emit flash light. At that time, since the electrostatic energy accumulated in advance is converted into an extremely short light pulse ranging from 0.1 to 10 milliseconds, the flash lamp 69 has a characteristic feature of emitting an extremely intense flash light as compared with a light source of successive lighting.

The controller 3 shown in FIG. 1 has a constitution of general computer system as hardware. Specifically, the controller 3 comprises a CPU for performing various computations, a ROM for storing a basic program, a RAM which is a readable and writable memory for storing various information, a magnetic disk for storing control applications or data, and the like. The controller 3 controls the motor 40, the valves 82 and 87, the trigger circuit 20 and a circuit to accumulate the electric charges in the capacitor.

Further, the heat treatment apparatus 1 of the first preferred embodiment comprises various cooling mechanisms (not shown) to prevent an excessive rise in temperature of the chamber 6 and the light emitting part 5 by the heat energy generated from the flash lamps 69 and the hot plate 71 in the heat treatment of the semiconductor wafer W. For example, a water cooled tube is provided on the chamber side portion 63 and the chamber bottom portion 62 of the chamber 6, and the light emitting part 5 is provided with a gas supply tube for supplying gas inside the light emitting part 5 and an exhaust tube with a silencer, which constitute an air cooling structure. A compressed air is supplied in a gap between the light-transmittable plate 61 and (the light diffusion plate 53 of) the light emitting part 5 to cool the light emitting part 5 and the light-transmittable plate 61 and remove organic matters or the like existing in the gap, thereby suppressing adhesion of the matters to the light diffusion plate 53 and the light-transmittable plate 61 during the heat treatment.

Next, a procedure for treating the semiconductor wafer W in the heat treatment apparatus 1 will be briefly discussed. The semiconductor wafer W to be treated herein is a semiconductor substrate doped with impurities by an ion implantation process. The activation of the implanted impurities is achieved by the heat treatment of the heat treatment apparatus 1.

First, the holding part 7 is placed in a position close to the chamber bottom portion 62, as shown in FIG. 1. The position of the holding part 7 shown in FIG. 1 within the chamber 6 is referred to hereinafter as a "transfer position." When the holding part 7 is in the transfer position, the upper ends of the support pins 70 protrude through the holding part 7 upwardly out of the holding part 7.

Next, the valve 82 and the valve 87 are opened to introduce nitrogen gas at room temperature into the heat treatment space 65 of the chamber 6. Subsequently, the transport opening 66 is opened, and a transport robot outside the apparatus 1 transports the ion-implanted semiconductor wafer W through the transport opening 66 into the chamber 6 and places the semiconductor wafer W onto the plurality of support pins 70.

The amount of nitrogen gas to be purged during the transport of the semiconductor wafer W into the chamber 6 is about 40 liters per minute. The nitrogen gas fed in the chamber 6 flows from the gas inlet buffer 83 in a direction indicated by the arrow AR4 of FIG. 2, and is exhausted through the outlet passage 86 and the valve 87 shown in FIG. 1 by using a utility exhaust system. Part of the nitrogen gas fed into the chamber 6 is also exhausted from an exhaust port (not shown) provided inside the bellows 47. In steps to be described below, the nitrogen gas always continues to be fed into and exhausted from the chamber 6, and the amount of nitrogen gas to be purged is changed to various amounts in accordance with the steps of processing the semiconductor wafer W.

Figure 4:
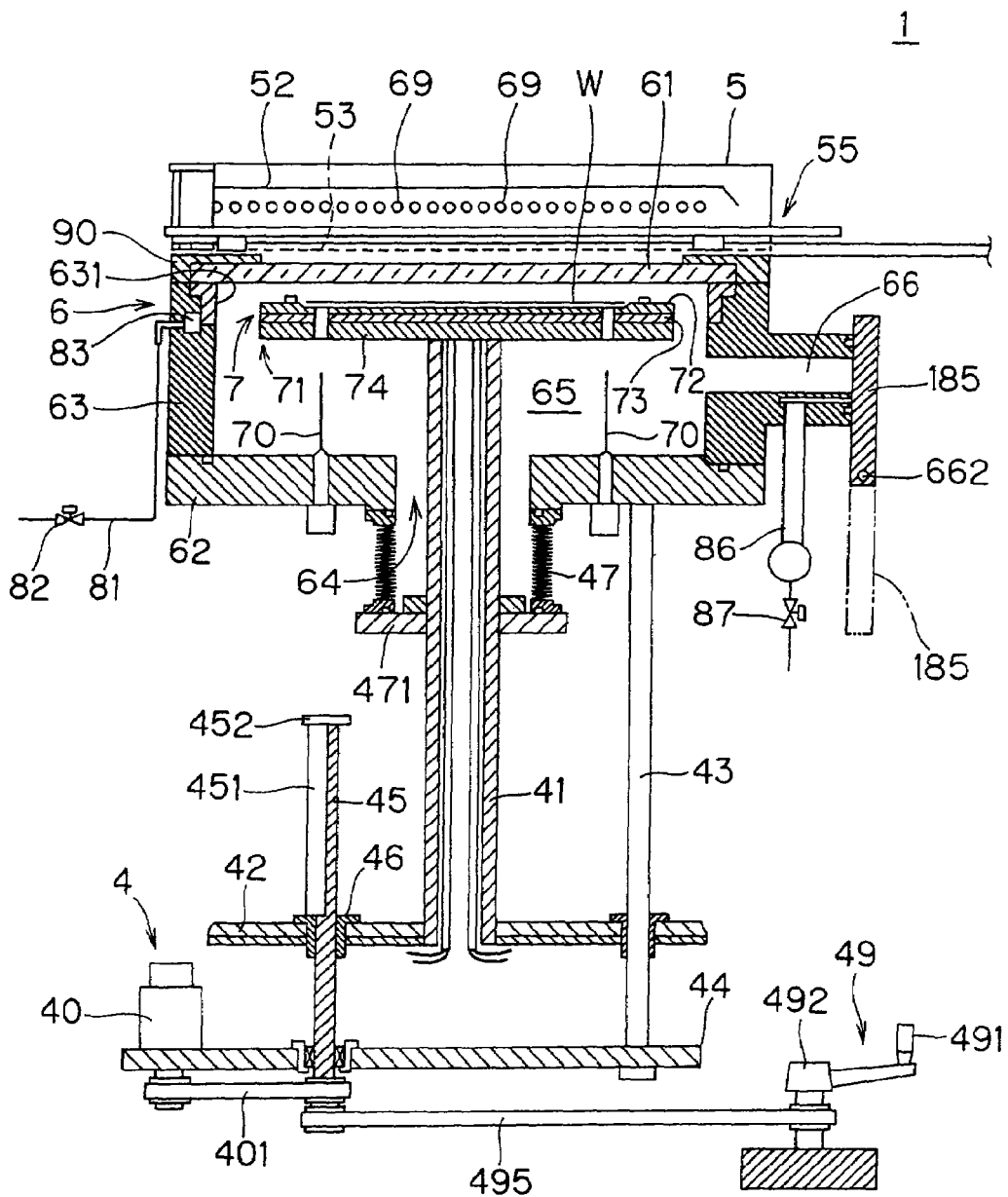
FIG. 4 is a sectional side view showing the construction of the heat treatment apparatus of FIG. 1.

After the semiconductor wafer W is transported into the chamber 6, the gate valve 185 closes the transport opening 66. Next, as shown in FIG. 4, the holding part elevating mechanism 4 moves the holding part 7 upwardly to a position (referred to hereinafter as a "heat treatment position") close to the light-transmittable plate 61. Then, the semiconductor wafer W is transferred from the support pins 70 to the susceptor 72 of the holding part 7, and is placed and held on the upper surface of the susceptor 72.

Each of the six zones 711 to 716 of the hot plate 71 is already heated up to a predetermined temperature by the resistance heating wire individually provided within each of the zones 711 to 716 (between the upper plate 73 and the lower plate 74). The holding part 7 is moved upwardly to the heat treatment position and the semiconductor wafer W comes in contact with the holding part 7, whereby the semiconductor wafer W is preheated and the temperature of the semiconductor wafer W increases gradually.

Preheating of the semiconductor wafer W at the heat treatment position for about 60 seconds increases the temperature of the semiconductor wafer W up to a preheating temperature T1 which is set in advance. The preheating temperature T1 is set ranging from about 200° C. to about 600° C., preferably from about 350° C. to about 550° C., at which there is no apprehension that the impurities implanted in the semiconductor wafer W might be diffused by heat. A distance between the holding part 7 and the light-transmittable plate 61 is adjustable to any value by controlling the amount of rotation of the motor 40 of the holding part elevating mechanism 4.

After a lapse of the preheating time of about 60 seconds, flash light is emitted from the light emitting part 5 toward the semiconductor wafer W under the control of the controller 3 while the holding part 7 remains in the heat treatment position. Part of the flash light emitted from the flash lamps 69 of the light emitting part 5 travels directly to the interior of the chamber 6. The remainder of the flash light is reflected by the reflector 52, and the reflected light travels to the interior of the chamber 6. Such emission of the flash light achieves the flash heating of the semiconductor wafer W. The flash heating, which is achieved by the emission of flash light from the flash lamps 69, can raise the surface temperature of the semiconductor wafer W in a short time.

Specifically, the flash light emitted from the flash lamps 69 in the light emitting part 5 is an intense flash of light emitted for an extremely short period of time ranging from about 0.1 to about 10 milliseconds because the previously stored electrostatic energy is converted into such an ultrashort light pulse. The surface temperature of the semiconductor wafer W subjected to the flash heating by the emission of flash light from the flash lamps 69 momentarily rises to a heat treatment temperature T2 of about 1000° C. to about 1100° C. After the impurities implanted in the semiconductor wafer W are activated, the surface temperature decreases quickly. Because of the capability of increasing and decreasing the surface temperature of the semiconductor wafer W in an extremely short time, the heat treatment apparatus 1 can achieve the activation of the impurities while suppressing the diffusion of the impurities implanted in the semiconductor wafer W due to heat. Such a diffusion phenomenon is also referred to as a round or dull (broadening of) profile of the impurities implanted in the semiconductor wafer W. Since the time period required for the activation of the implanted impurities is extremely short as compared with the time period required for the thermal diffusion of the implanted impurities, the activation is completed in a short time ranging from about 0.1 to about 10 milliseconds during which no diffusion occurs.

Preheating of the semiconductor wafer W by the holding part 7 prior to the flash heating allows the emission of flash light from the flash lamps 69 to quickly increase the surface temperature of the semiconductor wafer W up to the heat treatment temperature T2.

After waiting in the heat treatment position for about 10 seconds following the completion of the flash heating, the holding part 7 is moved downwardly again to the transfer position shown in FIG. 1 by the holding part elevating mechanism 4, and the semiconductor wafer W is transferred from the holding part 7 to the support pins 70. Subsequently, the gate valve 185 opens the transport opening 66 having been closed, and the transport robot outside the apparatus transports the semiconductor wafer W placed on the support pins 70 outwardly. Thus, the flash heating process of the semiconductor wafer W in the heat treatment apparatus 1 is completed.

As discussed above, the nitrogen gas is continuously fed to the chamber 6 during the heat treatment of the semiconductor wafer W in the heat treatment apparatus 1. The amount of nitrogen gas to be purged is about 30 liters per minute when the holding part 7 is in the heat treatment position, and be about 40 liters per minute when the holding part 7 is in a position other than the heat treatment position.

In the first preferred embodiment, all the 30 trigger electrodes 68 are fixed to the reflector 52. This eliminates the necessity to provide trigger wires one by one near the flash lamps 69 during the maintenance of the apparatus, the change of lamps or the like, and it is possible to easily provide the trigger electrodes 68 near the flash lamps 69 only by fixing the reflector 52 at a predetermined set position. As a result, the operation load for providing the trigger electrodes is drastically reduced, as compared with the conventional cases. In a process of manufacturing this apparatus, the trigger electrodes 68 have to be fixed to the reflector 52 so that the trigger electrodes 68 should be positioned immediately above the 30 flash lamps 69 when the reflector 52 is fixed at a predetermined set position.

As shown in the first preferred embodiment, if the trigger electrodes 68 are fixed to the reflector 52, it is possible to increase the thermal capacity with the cross-sectional area of the trigger electrode 68 increased to some degree, as compared with that of the trigger wire in the conventional cases. If the thermal capacity of the trigger electrode 68 made of a metal having high durability against a flash, such as aluminum or nickel, increases, since the heat that the trigger electrodes 68 receive on exposure to a flash of light is quickly conducted, to be diffused, it is possible to prevent disconnection of the trigger electrodes 68 due to hot melt or high temperature oxidation. In other words, it is possible to increase the durability of the trigger electrodes 68 against exposure to a flash of light.

Further, in the first preferred embodiment, since the 30 trigger electrodes 68 are connected in parallel to the single trigger circuit 20, it is possible to apply a voltage to all the 30 trigger electrodes 68 at the completely same timing. As a result, it is possible to make the light emission timings of the 30 flash lamps 69 coincident with one another. If a single trigger circuit 20 is provided, though a large step-up coil 22 is needed, it is possible to decrease the frequency of occurrence of failures of the trigger circuit and increase reliability, as compared with the case where a trigger circuit is provided for each of the 30 trigger electrodes 68 like in the conventional cases.

2. The Second Preferred Embodiment

Next, the second preferred embodiment of the present invention will be discussed. The overall construction of a heat treatment apparatus in accordance with the second preferred embodiment is almost the same as the construction of the first preferred embodiment shown in FIGS. 1 and 4. Further, the procedure for treating the semiconductor wafer W in the heat treatment apparatus of the second preferred embodiment is the same as that in the first preferred embodiment. The heat treatment apparatus of the second preferred embodiment is different from that of the first preferred embodiment in layout of the trigger electrodes.

FIG. 7 is a partially sectional view showing a reflector 52 and flash lamps 69 in accordance with the second preferred embodiment. In FIG. 7, the constituent elements identical to those in the first preferred embodiment are represented by the same reference signs. Also in the second preferred embodiment, 30 flash lamps 69 are provided and the layout of the flash lamps 69 and the reflector 52 is the same as that of the first preferred embodiment.

Though the trigger electrodes 68 are so fixed to the reflector 52 immediately above the 30 flash lamps 69 as to be proximately opposed to the 30 flash lamps 69 in a one-to-one correspondence with each other also in the second preferred embodiment, these 30 trigger electrodes 68 are so fixed directly to the reflector 52 as to establish electrical conduction. Specifically, the reflector 52 is made of an aluminum alloy which is a conductive material. The trigger electrodes 68 are also each made of an aluminum alloy (or nickel) which is a conductive material. Therefore, if the trigger electrodes 68 are fixed directly to the reflector 52, electrical conduction can be established therebetween.

Further, in the second preferred embodiment, the single trigger circuit 20 like that in the first preferred embodiment is so connected to the reflector 52 as to establish electrical conduction. Therefore, the 30 trigger electrodes 68 are connected to the trigger circuit 20 through the reflector 52. In the second preferred embodiment, when the trigger switch 21 of the trigger circuit 20 is turned on, a high voltage is applied to all the 30 trigger electrodes 68 through the reflector 52 at the same timing. In other words, the reflector 52 itself serves as a trigger electrode. In such a case, it is natural to attach the reflector 52 to which a high voltage is applied to the light emitting part 5 with an insulator interposed therebetween.

In spite of this construction, since all the 30 trigger electrodes 68 are fixed to the reflector 52, it is not necessary to provide trigger wires one by one near the flash lamps 69 during the maintenance of the apparatus, the change of lamps or the like, and it is possible to easily provide the trigger electrodes 68 near the flash lamps 69 only by fixing the reflector 52 at a predetermined set position. As a result, the operation load for providing the trigger electrodes is drastically reduced, like in the first preferred embodiment.

Further, since it is possible to increase the thermal capacity of the trigger electrode 68 also in the second preferred embodiment, the heat that the trigger electrodes 68 receive on exposure to a flash of light is quickly conducted, to be diffused, and it is thereby possible to prevent disconnection of the trigger electrodes 68 due to hot melt or high temperature oxidation.

Furthermore, since the 30 trigger electrodes 68 are connected to the single trigger circuit 20 through the reflector 52, it is possible to apply a voltage to all the 30 trigger electrodes 68 at the completely same timing. As a result, it is possible to make the light emission timings of the 30 flash lamps 69 coincident with one another. If a single trigger circuit 20 is provided, it is possible to decrease the frequency of occurrence of failures of the trigger circuit and increase reliability, as compared with the case where a trigger circuit is provided for each of the 30 trigger electrodes 68.

Though the construction of the second preferred embodiment in which a plurality of trigger electrodes 68 are so directly fixed to the reflector 52 as to establish electrical conduction is simpler than the construction of the first preferred embodiment, there is apprehension that the reflection pattern of the reflector 52 might be affected depending on the size of the trigger electrode 68. In such a case, it is preferable that the trigger electrodes 68 should be attached to the reflector 52 with the insulating members 67 (preferably, transparent insulating members) interposed therebetween like in the first preferred embodiment.

3. Variations

While the preferred embodiments of the present invention have been discussed hereinabove, the present invention allows numerous modifications and variations without departing from the scope and intention of the invention, besides the above-discussed specific embodiments. For example, although the 30 trigger electrodes 68 are connected in parallel to the single trigger circuit 20 in the first preferred embodiment, a trigger circuit may be provided for each of the 30 trigger electrodes 68. Also in such a case, it is possible to produce the effect of simplifying the operation of providing the trigger wires by fixing a plurality of trigger electrodes 68 to the reflector 52.

Further, in the first and second preferred embodiments, there may be a case where the 30 trigger electrodes 68 are divided into, e.g., 6 groups of 5 trigger electrodes and one trigger circuit is provided for each group. Specifically, a first number of trigger electrodes is divided into a plurality of trigger electrode groups each consisting of a second number of trigger electrodes, where the second number is smaller than the first number, and one trigger circuit may be provided for each trigger electrode group. Also in such a case, it is possible to decrease the frequency of occurrence of failures of the trigger circuit and increase reliability since only 6 trigger circuits are needed as compared with the conventional case where a trigger circuit is provided for each of the 30 trigger electrodes 68.

Though 30 flash lamps 69 are provided in the light emitting part 5 in the above-discussed preferred embodiments, the number of flash lamps is not limited to the above number but any number of flash lamps, only if more than 2, may be provided. Further, the flash lamp 69 is not limited to a xenon flash lamp but may be a krypton flash lamp.

The hot plate 71 is used as the assist-heating element in the above-mentioned preferred embodiments. A group of lamps (e.g., a plurality of halogen lamps), however, may be provided under the holding part 7 which holds the semiconductor wafer W to emit light therefrom, thereby achieving the assist-heating.

In the above-mentioned preferred embodiments, the ion activation process is performed by exposing the semiconductor wafer to light. The substrate to be treated by the heat treatment apparatus of the present invention is not limited to the semiconductor wafer. For example, the heat treatment apparatus of the present invention may perform the heat treatment on a glass substrate formed with various silicon films including a silicon nitride film, a polycrystalline silicon film and the like. As an example, silicon ions are implanted into a polycrystalline silicon film formed on a glass substrate by a CVD process to form an amorphous silicon film, and a silicon oxide film serving as an anti-reflection film is formed on the amorphous silicon film. In this state, the heat treatment apparatus of the present invention may expose the entire surface of the amorphous silicon film to light to polycrystallize the amorphous silicon film, thereby forming a polycrystalline silicon film.

Another modification may be made in a manner to be described below. A TFT substrate is prepared such that an underlying silicon oxide film and a polysilicon film produced by crystallizing amorphous silicon are formed on a glass substrate and the polysilicon film is doped with impurities such as phosphorus or boron. The heat treatment apparatus of the present invention may expose the TFT substrate to light to activate the impurities implanted in the doping step.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for exposing a substrate to a flash of light to heat the substrate, comprising:
    a plurality of flash lamps for emitting flash light by discharge caused between electrodes provided at both ends in the interior of a discharge tube;
    a holding element for holding a substrate;
    a reflecting plate for reflecting flash light emitted from said plurality of flash lamps towards said holding element, said reflecting plate being so disposed as to be opposed to said holding element with said plurality of flash lamps interposed therebetween and to cover said plurality of flash lamps; and
    a plurality of trigger electrodes for allowing said plurality of flash lamps to start discharging, said plurality of trigger electrodes being so fixed to said reflecting plate as to be proximately opposed to said plurality of flash lamps in a one-to-one correspondence with each other.

2. The heat treatment apparatus according to claim 1, wherein
    said reflecting plate is made of a conductive material, and
    said plurality of trigger electrodes are so fixed to said reflecting plate as to establish electrical conduction,
    said heat treatment apparatus further comprising
    a single trigger circuit for applying a voltage which allows said plurality of flash lamps to start discharging to said plurality of trigger electrodes through said reflecting plate, said trigger circuit establishing electrical conduction with said reflecting plate.

3. The heat treatment apparatus according to claim 1, wherein
    said plurality of trigger electrodes are fixed to said reflecting plate with insulating members interposed therebetween, respectively,
    said heat treatment apparatus further comprising
    a single trigger circuit to which said plurality of trigger electrodes are connected in parallel, for applying a voltage which allows said plurality of flash lamps to start discharging to said plurality of trigger electrodes.

4. The heat treatment apparatus according to claim 1, wherein
    said plurality of trigger electrodes are fixed to said reflecting plate with insulating members interposed therebetween, respectively, and
    said plurality of trigger electrodes are divided into a plurality of trigger electrode groups,
    said heat treatment apparatus further comprising
    a single trigger circuit provided for each of said plurality of trigger electrode groups,
    wherein said trigger circuit applies a voltage which allows said plurality of flash lamps to start discharging to said plurality of trigger electrodes included in the corresponding trigger electrode group.

5. The heat treatment apparatus according to claim 1, wherein
    said plurality of trigger electrodes are each made of aluminum or nickel to have a square pole configuration.

* * * * *